United States Patent
Masui et al.

(10) Patent No.: US 8,183,074 B2
(45) Date of Patent: May 22, 2012

(54) LIGHT EMITTING ELEMENT, METHOD FOR MANUFACTURING LIGHT EMITTING ELEMENT, LIGHT EMITTING ELEMENT ASSEMBLY, AND METHOD FOR MANUFACTURING LIGHT EMITTING ELEMENT ASSEMBLY

(75) Inventors: Yuji Masui, Kanagawa (JP); Takahiro Arakida, Kanagawa (JP); Rintaro Koda, Tokyo (JP); Tomoyuki Oki, Kanagawa (JP)

(73) Assignee: Sony Corporation, Tokyo (JP)

( * ) Notice: Subject to any disclaimer, the term of this patent is extended or adjusted under 35 U.S.C. 154(b) by 11 days.

(21) Appl. No.: 12/013,748

(22) Filed: Jan. 14, 2008

(65) Prior Publication Data

US 2008/0232414 A1 Sep. 25, 2008

(30) Foreign Application Priority Data

Jan. 19, 2007 (JP) ................... 2007-010580

(51) Int. Cl.
*H01L 21/479* (2006.01)

(52) U.S. Cl. ........... 438/39; 257/466; 257/E33.011; 372/46.013

(58) Field of Classification Search ............ 438/39; 372/46.013; 257/466, E33.011
See application file for complete search history.

(56) References Cited

U.S. PATENT DOCUMENTS

| | | | | |
|---|---|---|---|---|
| 4,190,813 A | * | 2/1980 | Logan et al. | 372/45.01 |
| 5,412,680 A | * | 5/1995 | Swirhun et al. | 372/45.01 |
| 5,896,408 A | * | 4/1999 | Corzine et al. | 372/46.013 |
| 6,304,588 B1 | * | 10/2001 | Chua et al. | 372/46.013 |
| 2002/0154675 A1 | * | 10/2002 | Deng et al. | 372/96 |
| 2004/0213310 A1 | * | 10/2004 | Otoma | 372/45 |
| 2005/0019973 A1 | * | 1/2005 | Chua | 438/42 |
| 2005/0100070 A1 | * | 5/2005 | Nakayama et al. | 372/50 |
| 2006/0187991 A1 | * | 8/2006 | Thornton | 372/46.013 |

FOREIGN PATENT DOCUMENTS

| | | |
|---|---|---|
| JP | 10-229248 | 8/1998 |
| JP | 11-150340 | 6/1999 |
| JP | 2000-036637 | 2/2000 |
| JP | 2000-307189 | 11/2000 |
| JP | 2001-210908 | 8/2001 |
| JP | 2002-289976 | 10/2002 |
| JP | 2002-299761 | 10/2002 |
| JP | 2003-249719 | 9/2003 |
| JP | 2004-288902 | 10/2004 |
| JP | 2005-026625 | 1/2005 |
| JP | 2005-045243 | 2/2005 |
| WO | 2005/093918 | 10/2005 |

\* cited by examiner

*Primary Examiner* — Thao Le
*Assistant Examiner* — Allen Parker
(74) *Attorney, Agent, or Firm* — SNR Denton US LLP

(57) ABSTRACT

A method for manufacturing a light emitting element includes the steps of (A) forming sequentially a first compound semiconductor layer having a first conduction type, an active layer, and a second compound semiconductor layer having a second conduction type on a substrate, (B) forming a plurality of point-like hole portions in a thickness direction in at least a region of the second compound semiconductor layer located outside a region to be provided with a current confinement region, and (C) forming an insulating region by subjecting a part of the second compound semiconductor layer to an insulation treatment from side walls of the hole portions so as to produce the current confinement region surrounded by the insulating region in the second compound semiconductor layer.

3 Claims, 14 Drawing Sheets

[STEP-100]

[STEP-110]

[STEP-120]

[STEP-120] (CONTINUED)

[STEP-130]

[STEP-140 & STEP-150]

LIGHT EMITTING ELEMENT, METHOD FOR MANUFACTURING LIGHT EMITTING ELEMENT, LIGHT EMITTING ELEMENT ASSEMBLY, AND METHOD FOR MANUFACTURING LIGHT EMITTING ELEMENT ASSEMBLY

CROSS REFERENCES TO RELATED APPLICATIONS

The present invention contains subject matter related to Japanese Patent Application JP 2007-010580 filed in the Japanese Patent Office on Jan. 19, 2007, the entire contents of which are incorporated herein by reference.

BACKGROUND OF THE INVENTION

1. Field of the Invention

The present invention relates to a light emitting element, a method for manufacturing the light emitting element, a light emitting element assembly, and a method for manufacturing the light emitting element assembly.

2. Description of the Related Art

In a surface emitting laser element, for example, an active layer having a multi-quantum well structure is disposed in a cavity sandwiched by two mirror layers disposed in a vertical direction on a substrate. The light generated in the active layer by current injection is confined so as to produce laser oscillation. As disclosed in, for example, Japanese Unexamined Patent Application Publication No. 2001-210908, a cylindrical mesa structure is usually adopted in the surface emitting laser element. Specifically, for example, a cylindrical mesa structure having a diameter of about 30 μm is produced on the basis of a dry etching method or the like. This mesa structure is composed of, for example, a laminated structure of a n-type compound semiconductor layer, an active layer, and a p-type compound semiconductor layer. A part of the p-type compound semiconductor layer is oxidized from a side surface of the mesa structure and, thereby, a current confinement region is disposed at a center portion of the p-type compound semiconductor layer. Subsequently, the mesa structure is covered with an insulating layer, a part of the top surface of the p-type compound semiconductor layer is removed, and a ring-shaped p-side electrode is formed around the perimeter of the top surface of the p-type compound semiconductor layer. In addition, an n-type electrode is formed on the back surface of the substrate. The disposition of such a current confinement region can facilitate high-efficiency injection of current into the active layer. Consequently, regarding the surface emitting laser having the above-described structure, a current is injected into the active layer efficiently, and laser oscillation can be performed with a high degree of efficiency.

SUMMARY OF THE INVENTION

In the step of forming a current confinement region, for example, a current confinement region having a diameter of about a few micrometers is usually formed. In formation of the current confinement region, frequently, an oxidation treatment of a p-type compound semiconductor layer is performed in a high-temperature steam atmosphere. Here, the oxidation treatment is controlled on the basis of the time period of exposure of the p-type compound semiconductor layer to the high-temperature steam atmosphere. In a part of the p-type compound semiconductor layer, the current confinement region is surrounded by an oxidized region. The width of the current confinement region or the width of the oxidized region (the width of the oxidized region formed from the side surface of a mesa structure toward the center portion of the mesa structure) is an important factor in determination of the characteristics of a surface emitting laser. In the step of forming the current confinement region, the width of the current confinement region or the width of the oxidized region is required to have an accuracy of about ±0.5 μm. However, variations may occur in progress of oxidation of the p-type compound semiconductor layer depending on the amount of supply of high-temperature steam, the temperature of atmosphere, the temperature of substrate, the thickness of compound semiconductor layer, the impurity concentration in compound semiconductor layer, and the like. In such cases, it becomes difficult to accurately control the width of oxidized region, and a reduction of the productivity (yield) of surface emitting laser element results.

In the step of forming the current confinement region in a method for manufacturing a surface emitting laser element according to the related art, the oxidation reaction rate increases as the oxidation proceeds. That is, since the oxidation is performed from the side surface of the mesa structure, the formation of oxidized region in the p-type compound semiconductor layer advances toward the center portion of the mesa structure by the oxidation treatment. At this time, the area of the boundary (may be referred to as oxidation front, for the sake of convenience), at which the oxidation proceeds, of the p-type compound semiconductor layer decreases, and the amount of oxidation species (water molecules, oxygen molecules, and the like) per unit area of the oxidation front increases. As a result, the oxidation reaction rate increases as the oxidation proceeds. Consequently, accurate control of the width of oxidized region becomes difficult as the current confinement region becomes small.

A method for dealing with such problems, that is, a method for improving the controllability in the formation of the oxidized region, is disclosed in, for example, Japanese Unexamined Patent Application Publication No. 2005-026625. In the technology disclosed in Japanese Unexamined Patent Application Publication No. 2005-026625, control is performed by irradiating a portion to be oxidized with laser light, raising the temperature and, thereby, increasing the reaction rate of the irradiated portion. However, in this method, each mesa structure needs to be irradiated with the laser light. Therefore, problems occur in the magnitude of laser output and the uniformity. Furthermore, it is difficult to produce effective temperature contrast in the mesa structure by the resolution of a few micrometers, that is, to accurately generate a temperature difference in a small region.

Accordingly, it is desirable to provide a method for manufacturing a light emitting element or a light emitting element assembly, in which the width (size) of a current confinement region can be accurately controlled on the basis of an easy method in formation of the current confinement region, and a light emitting element or a light emitting element assembly produced by the above-described method for manufacturing a light emitting element or a light emitting element assembly.

A method for manufacturing a light emitting element according to an embodiment of the present invention includes the steps of (A) forming sequentially a first compound semiconductor layer having a first conduction type, an active layer, and a second compound semiconductor layer having a second conduction type on a substrate, (B) forming a plurality of point-like hole portions in a thickness direction in at least a region of the second compound semiconductor layer located outside a region to be provided with a current confinement region, and (C) forming an insulating region by subjecting a part of the second compound semiconductor layer to an insulation treatment from side walls of the hole portions so as to produce the current confinement region surrounded by the insulating region in the second compound semiconductor layer.

A method for manufacturing a light emitting element assembly according to an embodiment of the present invention includes the steps of (A) forming sequentially a first compound semiconductor layer having a first conduction type, an active layer, and a second compound semiconductor layer having a second conduction type on a substrate, (B) forming a plurality of point-like hole portions in a thickness direction in at least a region of the second compound semiconductor layer located outside each region to be provided with $K_0$ discrete current confinement regions having different sizes (where $K_0$ represents an integer of two or more) in each region to be provided with a light emitting element assembly, (C) forming an insulating region by subjecting a part of the second compound semiconductor layer to an insulation treatment from side walls of the hole portions so as to produce the current confinement region surrounded by $K_0$ insulating regions in a part of the second compound semiconductor layer, (D) removing at least a part of the second compound semiconductor layer and the active layer selectively so as to expose a part of the first compound semiconductor layer and produce $K_1$ mesa structures (where $K_1$ represents an integer of one or more, and $K_1 < K_0$) including at least the remaining second compound semiconductor layer and active layer in order to form $K_1$ light emitting elements in each region to be provided with a light emitting element assembly, (E) forming a first electrode connected to the first compound semiconductor layer, and forming a second electrode at a part of the top surface of the second compound semiconductor layer in each of $K_1$ mesa structures in each region to be provided with a light emitting element assembly, and (F) separating each region to be provided with a light emitting element assembly.

A light emitting element according to an embodiment of the present invention is produced by (A) forming sequentially a first compound semiconductor layer having a first conduction type, an active layer, and a second compound semiconductor layer having a second conduction type on a substrate, (B) forming a plurality of point-like hole portions in a thickness direction in at least a region of the second compound semiconductor layer located outside a region to be provided with a current confinement region, (C) forming an insulating region by subjecting a part of the second compound semiconductor layer to an insulation treatment from side walls of the hole portions so as to produce the current confinement region surrounded by the insulating region in the second compound semiconductor layer, (D) removing at least a part of the second compound semiconductor layer and the active layer selectively so as to expose a part of the first compound semiconductor layer and produce a mesa structure including at least the remaining second compound semiconductor layer and active layer, and (E) forming a first electrode connected to the first compound semiconductor layer, and forming a second electrode at a part of the top surface of the second compound semiconductor layer.

A light emitting element assembly according to an embodiment of the present invention is produced by (A) forming sequentially a first compound semiconductor layer having a first conduction type, an active layer, and a second compound semiconductor layer having a second conduction type on a substrate, (B) forming a plurality of point-like hole portions in a thickness direction in at least a region of the second compound semiconductor layer located outside each region to be provided with $K_0$ discrete current confinement regions having different sizes (where $K_0$ represents an integer of two or more) in each region to be provided with a light emitting element assembly, (C) forming an insulating region by subjecting a part of the second compound semiconductor layer to an insulation treatment from side walls of the hole portions so as to produce the current confinement region surrounded by $K_0$ insulating regions in a part of the second compound semiconductor layer, (D) removing at least a part of the second compound semiconductor layer and the active layer selectively so as to expose a part of the first compound semiconductor layer and produce $K_1$ mesa structures (where $K_1$ represents an integer of one or more, and $K_1 < K_0$) including at least the remaining second compound semiconductor layer and active layer in order to form $K_1$ light emitting elements in each region to be provided with a light emitting element assembly, (E) forming a first electrode connected to the first compound semiconductor layer, and forming a second electrode at a part of the top surface of the second compound semiconductor layer in each of $K_1$ mesa structures in each region to be provided with a light emitting element assembly, and (F) separating each region to be provided with a light emitting element assembly.

Regarding the light emitting element assembly or the method for manufacturing the light emitting element assembly according to an embodiment of the present invention, the value of $K_1$ may be an integer of one or more.

Regarding the light emitting element, the method for manufacturing the light emitting element, the light emitting element assembly, or the method for manufacturing the light emitting element assembly according to an embodiment of the present invention (hereafter these may be simply collectively referred to as the present invention), in application of the insulation treatment to a part of the second compound semiconductor layer from side walls of the hole portions in the above-described step (C), formation of an insulating region proceeds by the insulation treatment from a side wall of one hole portion, and formation of another insulating region proceeds by the insulation treatment from a side wall of another hole portion adjacent to the one hole portion. At this time, it is preferable that the curvatures of the boundaries of insulating regions developing by the insulation treatment (may be referred to as insulating region front, for the sake of convenience) take on positive values relative to the respective hole portions (that is, when the center portion of each hole portion is assumed to be an origin point) before the two insulating regions join together, or it is preferable that the lengths of the boundaries of insulating regions (insulating region front) developing by the insulation treatment increases as the insulation treatment proceeds before the two insulating regions join together.

In the present invention including the above-described preferred embodiments, it is desirable that the top portions of the plurality of point-like hole portions are disposed on a virtual closed curve located outside the region to be provided with the current confinement region. In this case, examples of the virtual closed curve may include a circle, an ellipse, ovals (figures formed by combining two semicircles and two line segments), a square, rectangles, quadrangles including rhombuses and parallelograms, polygons, rounded quadrangles, and rounded polygons. In the case where the virtual closed curve is assumed to be a circle, it is favorable that $$0 < (M \times R_1^2)/R_0^2 \leq 1$$

preferably, $$0 < (M \times R_1^2)/R_0^2 \leq 0.2$$

is satisfied, where $R_0$ represents the diameter of the assumed circle, $R_1$ represents the diameter of a cross-section, which is assumed to be circular, of the hole portion, and M represents the number of hole portions. Here, the diameter $R_0$ refers to the diameter of a circle assumed to have an area equal to the area of the region surrounded by the virtual closed curve. The diameter $R_1$ refers to the diameter of a circle assumed to have an area equal to the area of the cross-sectional shape of the hole portion (cross-sectional shape of the hole cut with a plane perpendicular to the direction of the axial line of the hole portion). Preferably, the value of $R_1$ satisfies, for example, $1\ \mu m \leqq R_1 \leqq 5\ \mu m$.

Furthermore, in the present invention including the above-described preferred embodiments and configurations, it is desirable that the value of M is three or more, preferably eight or more, where M represents the number of hole portions. The upper limit of the value of M may be determined appropriately.

In the present invention including the above-described preferred embodiments and configurations, the insulation treatment may be an oxidation treatment applied to a part of the second compound semiconductor layer, although not limited to such a treatment. The insulation treatment may be a nitriding treatment, a treatment to disorder a part of the second compound semiconductor layer, or a treatment to diffuse impurities into a part of the second compound semiconductor layer by performing ion implantation into a part of the side wall of the hole portion and, thereafter, performing a heat treatment. Furthermore, in the case where the insulation treatment is the oxidation treatment, high-temperature steam (for example, an atmosphere of the air containing 1 to 50 percent by volume of steam at 50° C. to 100° C.) may be used in the oxidation treatment. Moreover, in this case, the second compound semiconductor layer may have a three-layered structure of a lower layer, a middle layer (current confinement layer), and an upper layer from the active layer side, at least the middle layer may be formed from a group III-V semiconductor containing aluminum (Al) as a group III atom, the insulating region and the current confinement region may be formed in the middle layer, and the value of atomic percent of aluminum (Al) in the compound semiconductor composition of the middle layer may be higher than the values of atomic percent of aluminum in the compound semiconductor compositions of the lower layer and the upper layer. Examples of group III atoms may include gallium (Ga) and indium (In). Examples of group V atoms may include arsenic (As), phosphorus (P), and antimony (Sb). More specifically, examples of combinations of compound semiconductor compositions constituting (middle layer/lower layer and upper layer) may include (AlAs/GaAs), (AlAs/InAs), (AlAs/AlGaAs), (AlAs/AlInAs), (AlAs/AlAsP), (AlAs/GaInAs), (AlAs/AlGaInAs), (AlAs/GaInAsP), (AlP/GaP), (AlP/InP), (AlP/AlGaP), (AlP/AlInP), (AlP/AlAsP), (AlP/AlGaInP), (AlSb/AlInSb), (AlGaAs/AlGaAs), (AlInAs/AlInGaAs), (AlInAs/AlGaAs), (AlGaAs/AlGaAsP), (AlInAsP/AlGaAsP), and (AlN/AlGaN). Examples of compound semiconductors constituting the first compound semiconductor layer may include AlAs, GaAs, AlGaAs, AlP, GaP, GaInP, AlInP, AlGaInP, AlAsP, GaAsP, AlGaAsP, AlInAsP, GaInAsP, AlInAs, GaInAs, AlGaInAs, AlAsSb, GaAsSb, AlGaAsSb, AlN, GaN, InN, and AlGaN. Examples of compound semiconductors constituting the active layer may include GaAs, AlGaAs, GaInAs, GaInAsP, GaInP, GaSb, GaAsSb, GaN, InN, and GaInN. Examples of methods for forming these layers (film formation methods) may include a metal organic chemical vapor deposition method (MOCVD method), a molecular beam epitaxy method (MBE method), and a hydride vapor deposition method in which a halogen contributes to transportation or reaction.

In the methods for manufacturing a light emitting element according to embodiments of the present invention including the above-described preferred embodiments and configurations, after the above-described step (C) is performed, preferably, at least a part of the second compound semiconductor layer and the active layer are removed selectively so as to expose a part of the first compound semiconductor layer and produce a mesa structure including at least the remaining second compound semiconductor layer and active layer. In this case, after the mesa structure is produced, more preferably, a first electrode connected to the first compound semiconductor layer is formed, and a second electrode is formed at a part of the top surface of the second compound semiconductor layer. In the present invention, the second electrode may be formed after the first electrode is formed, or the first electrode may be formed after the second electrode is formed.

In the present invention including the above-described preferred embodiments and configurations, examples of the light emitting elements may include a surface emitting laser element (vertical cavity surface emitting laser, VCSEL) for emitting light from the second compound semiconductor layer. Sometimes, the light emitting element may be composed of an edge emitting laser element for emitting light from an end surface.

In the present invention, a plurality of point-like hole portions are formed in a thickness direction in at least the region of the second compound semiconductor layer located outside the region to be provided with the current confinement region (or each region to be provided with $K_0$ discrete current confinement regions). Here, the plurality of point-like hole portions may penetrate the second compound semiconductor layer and extend to the active layer or may penetrate the active layer and extend to some midpoint in the first compound semiconductor layer.

In the present invention, at least a part of the second compound semiconductor layer and the active layer are removed selectively so as to expose a part of the first compound semiconductor layer and produce a columnar (for example, in the shape of a hollow cylinder or a circular column) mesa structure including at least the remaining second compound semiconductor layer and active layer. However, not only the second compound semiconductor layer and the active layer are removed selectively, but also a part of the first compound semiconductor layer in a thickness direction may be removed selectively. That is, in the mesa structure, at least the second compound semiconductor layer and the active layer are left in the shape of a type of island. However, the second compound semiconductor layer, the active layer, and a part of the first compound semiconductor layer may be left in the shape of a type of island.

In the present invention, the point-like hole portion may be formed on the basis of the combination of the lithography and dry etching technology according to the related art. The mesa structure may be formed on the basis of, for example, the combination of the lithography and dry etching technology or wet etching technology according to the related art.

In the present invention, examples of substrates include a sapphire substrate, a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and these substrates provided with a substrate layer, a buffer layer, or the like on their surfaces (main surfaces).

In the present invention, the first conduction type may be an n-type, and the second conduction type may be a p-type.

In the present invention, the lower layer (the layer nearer to the active layer) of the second compound semiconductor layer, relative to the substrate side, may be made into a second clad layer, for example. The upper layer (the layer farther from the active layer) of the second compound semiconductor layer may be made into a second DBR layer, for example. The first compound semiconductor layer may have a laminated structure of, for example, a first DBR layer located at a position farther from the active layer and a first clad layer located at a position nearer to the active layer. In general, the optical thickness of the layer constituting the DBR layer is $\lambda/4$ (where $\lambda$ represents an oscillation wavelength). Examples of n-type impurities to be added to the compound semiconductor layer may include silicon (Si) and selenium (Se). Examples of p-type impurities may include zinc (Zn), magnesium (Mg), and beryllium (Be).

The material constituting the first electrode and the second electrode may be determined on the basis of the conduction type of the substrate layer for forming the first electrode and the second electrode or be determined on the basis of the direction of emission of the light. For example, in the case where the conduction type of the substrate layer is the p-type, the electrodes may be formed from silver (including a silver alloy containing In, Cu, Pd, Ni, Co, Rh, or Pt), Ti/Au, Cr/Au, or the like. In the case where the conduction type of the substrate layer is the n-type, the electrodes may be formed from titanium (Ti), an electrode composed of titanium alloy, e.g., TiW or TiMo, (for example, TiW layer or Ti layer/Ni layer/Au layer), aluminum (Al), an aluminum alloy, AuGe, AuGe/Ni/Au, or the like. The first electrode may be formed on the back surface of the substrate or on the portion of the first compound semiconductor layer exposed in the formation of the mesa structure, depending on the constituent material for the substrate to be used. In the case where the electrode needs to be made transparent, it is favorable that the electrode is formed from ITO. Regarding the electrode having a laminated structure, the material described before "/ (slash)" is located on the substrate side. If necessary, the electrode may be provided with a contact portion (pad portion) composed of a multilayer metal layer having a laminated configuration, such as {adhesion layer (Ti layer, Cr layer, or the like)}/ {barrier metal layer (Pt layer, Ni layer, TiW layer, or Mo layer)}/{metal layer having good compatibility with mounting (for example, Au layer)}, e.g., Ti layer/Pt layer/Au layer. The electrode and the contact portion (pad portion) may be formed by, for example, various PVD methods, e.g., a vacuum deposition method and a sputtering method, various CVD methods, and a plating method.

The two-dimensional shape of the current confinement region is determined on the basis of the shape of the virtual closed curve, on which the top portions of the plurality of point-like hole portions are located, the number of point-like hole portions, the insulation rate depending on the crystal face direction of the insulation treatment of the second compound semiconductor layer, and the like. Therefore, the shape of the virtual closed curve and the number of point-like hole portions may be determined in such a way that a desired two-dimensional shape is obtained.

In an embodiment of the present invention, a plurality of point-like hole portions in a thickness direction are formed in at least a region of the second compound semiconductor layer located outside a region to be provided with the current confinement region (or each region to be provided with $K_0$ discrete current confinement regions). Subsequently, an insulating region is formed by subjecting a part of the second compound semiconductor layer to the insulation treatment from side walls of the hole portions. Here, the formation of the insulating region is started from the side wall of the hole portion and is extended outward centering the hole portion. Consequently, as the insulation treatment proceeds, the amount of species, e.g., oxidation species, to be subjected to the insulation treatment per unit area of the insulation front decreases and, thereby, the rate of insulation treatment decreases. Therefore, even when the current confinement structure is small, the width of the current confinement region or the width of the insulating region can be easily accurately controlled. Since this can be performed merely by forming the plurality of point-like hole portions, the current confinement region itself is formed easily.

Regarding the light emitting element assembly and the method for manufacturing the light emitting element assembly according to embodiments of the present invention, in each region to be provided with the light emitting element assembly, first of all, $K_0$ current confinement regions are produced through the steps (B) and (C) in such a way that $K_0$ units of light emitting elements can be formed. In the step (D), $K_1$ mesa structures are produced in such a way that $K_1$ light emitting elements can be formed. Therefore, the steps upstream from the step of forming the mesa structure can be standardized by, for example, changing the areas of $K_0$ current confinement regions from each other in the steps (B) and (C) and designating a current confinement region to be left in advance, so that the steps can be simplified and streamlined.

Furthermore, in the etching of the second compound semiconductor layer and the active layer to form the mesa structure, etching of, for example, the first compound semiconductor layer also proceeds at the bottom of the hole portion. However, the hole portion is fine and, therefore, the degree of proceeding of etching of the first compound semiconductor layer at the bottom of the hole portion is low. Consequently, even when traces of hole portions may be left on the first compound semiconductor layer, these remaining traces of hole portions do not become very deep. Therefore, the surface of the first compound semiconductor layer, which is exposed after the mesa structure is formed, is relatively flat. The extended portion of the second electrode and the pad portion are easily formed on the exposed first compound semiconductor layer, or the flexibility in positioning of formation (routing) of the extended portion and the pad portion increases. As a result, the yield in production of the light emitting element can be improved. In particular, this is effective with respect to the surface emitting laser element, in which the area of the pad portion is difficult to neglect, and is further effective in production of the light emitting element assembly.

DESCRIPTION OF THE PREFERRED EMBODIMENTS

The present invention will be described below on the basis of the examples with reference to the drawings.

Example 1

Figure 1A:
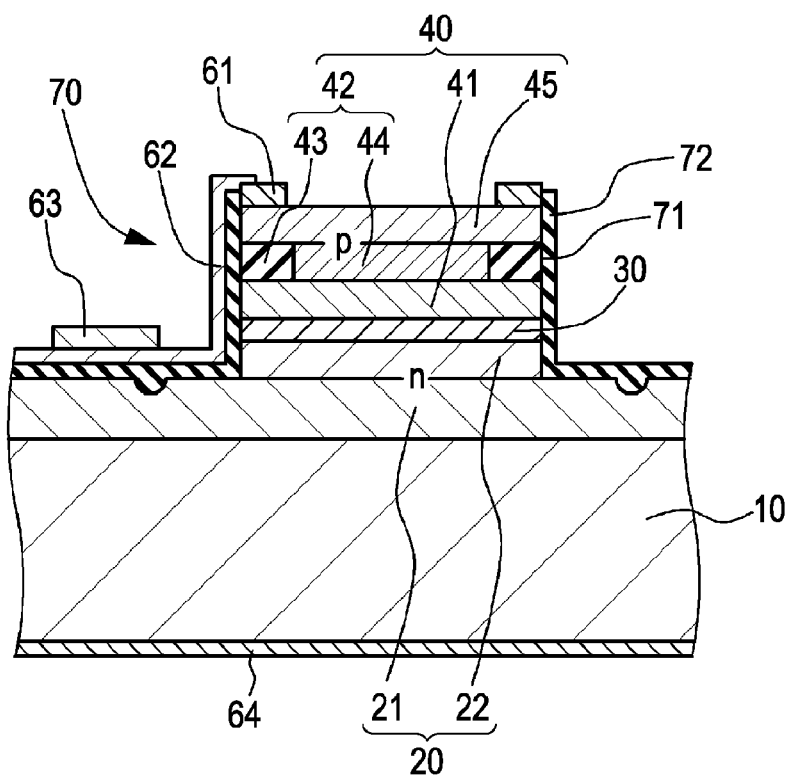
FIGS. 1A and 1B are a schematic partial sectional view and a schematic partial plan view, respectively, of a light emitting element in Example 1.
Figure 1B:
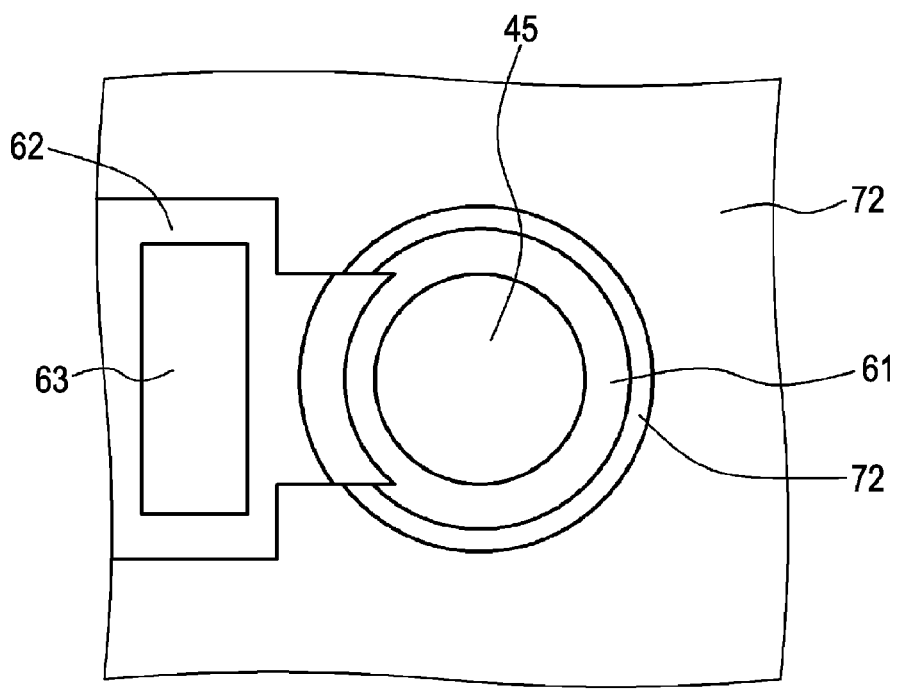

Example 1 relates to a light emitting element and a method for manufacturing the light emitting element according to embodiments of the present invention. FIG. 1A is a schematic partial sectional view of the light emitting element in Example 1 and FIG. 1B is a schematic partial plan view. In Example 1 or in Example 2 or Example 3 described later, a first conduction type is specified to be an n-type and a second conduction type is specified to be a p-type. In Example 1 or in Example 2 or Example 3 described later, the light emitting element is composed of a surface emitting laser element (vertical cavity surface emitting laser, VCSEL) for emitting light through a second compound semiconductor layer.

The light emitting element in Example 1 or in Example 2 or Example 3 described later is composed of a first compound semiconductor layer 20, an active layer 30, and a second compound semiconductor layer 40 disposed on a substrate 10 formed from an n-type GaAs substrate. The first compound semiconductor layer 20 is composed of a laminated structure of a first DBR layer 21 and a first clad layer 22 having the compositions described below from the substrate side. The active layer 30 has a multi-quantum well structure having the composition described below. Furthermore, the second compound semiconductor layer 40 is composed of a laminated structure of a lower layer (second clad layer) 41, a middle layer (current confinement layer) 42 and an upper layer (second DBR layer) 45, which have the compositions described below, from the substrate side. The middle layer (current confinement layer) 42 is composed of an insulating region 43 formed from a side surface 71 of a mesa structure 70 toward a center portion of the mesa structure 70 and a current confinement region 44 surrounded by the insulating region 43. The two-dimensional shape of the current confinement region 44 is nearly a regular octagon with concave sides. The diameter $R_2$ of a circle assumed to have an area equal to the area of the above-described two-dimensional shape (refer to FIG. 7) is 10 μm. The mesa structure is in the shape of a circular column, and the diameter $R_3$ thereof (refer to FIG. 4A) is 30 μm. The two-dimensional shape of the current confinement region 44 exerts an influence on, for example, a far field pattern (FFP), a transverse mode, and a longitudinal mode.

TABLE 1

| Second compound semiconductor layer 40 | |
|---|---|
| Upper layer (second DBR layer) 45 | DBR layer in which a plurality of p-$Al_{0.9}Ga_{0.1}As$ layers and p-$Al_{0.1}Ga_{0.9}As$ layers are laminated alternately |
| Middle layer (current confinement layer) 42 | p-AlAs |
| Lower layer (second clad layer) 41 | p-$Al_{0.3}Ga_{0.7}As$ |
| Active layer 30 | i-GaAs/$Al_{0.3}Ga_{0.7}As$ |
| First compound semiconductor layer 20 | |
| First clad layer 22 | n-$Al_{0.3}Ga_{0.7}As$ |
| First DBR layer 21 | DBR layer in which a plurality of n-$Al_{0.9}Ga_{0.1}As$ layers and n-$Al_{0.1}Ga_{0.9}As$ layers are laminated alternately |

In the light emitting element in Example 1 or in Example 2 or Example 3 described later, an insulating layer 72 is disposed on the side surface 71 of the mesa structure 70 and an exposed first compound semiconductor layer 20 (more specifically, an exposed first DBR layer 21). A ring-shaped second electrode (p-side electrode 61) is disposed around the perimeter of the top surface of the second compound semiconductor layer 40 corresponding to the top surface of the mesa structure 70. An extension portion 62 is extended from the p-side electrode 61 and is further extended over the insulating layer 72 on the side surface 71 of the mesa structure 70 and the insulating layer 72 disposed on the exposed first compound semiconductor layer 20. A pad portion 63 is disposed on a portion of the extension portion 62 above the exposed first compound semiconductor layer 20. On the other hand, a first electrode (n-side electrode 64) is disposed on the back surface of the substrate 10. The n-side electrode 64 is formed from a AuGe alloy layer and is connected to the first compound semiconductor layer 20 through the substrate 10. The p-side electrode 61 and the extension portion 62 are configured to have a laminated structure of Ti layer/Au layer, and the pad portion 63 has a laminated structure of Ti layer/Pt layer/Au layer. The insulating layer 72 is formed from, for example, $SiO_2$. Examples of other materials for constituting the insulating layer may include $SiO_X$ based materials, $SiN_Y$ based materials, $SiO_XN_Y$ based materials, $Ta_2O_5$, $ZrO_2$, AlN, and $Al_2O_3$. Examples of methods for manufacturing the insulating layer may include PVD methods, e.g., a vacuum deposition method and a sputtering method, and CVD methods.

The outline of the method for manufacturing the light emitting element in Example 1 will be described below with reference to FIGS. 2A and 2B, FIGS. 3A and 3B, and FIGS. 4A and 4B, which are schematic partial end elevation views of the substrate and the like, FIG. 5A, which is a schematic diagram of the second compound semiconductor layer viewed from above, and FIG. 5B, FIGS. 6A and 6B, and FIG. 7, which are schematic diagrams of the middle layer 42 cut with a virtual plane parallel to the main surface of the substrate 10. Each of layers may be formed by, for example, a MOCVD method. At this time, for example, trimethylaluminum (TMA), trimethylgallium (TMG), and arsine are used as the materials for a group III-V semiconductor. For example, $H_2Se$ is used as the material for donor impurity. For example, dimethylzinc (DMZ) is used as the material for the acceptor impurity. Etching of each layer may be performed by, for example, a dry etching technology with a chlorine based gas.

Step-100

Figure 2A:
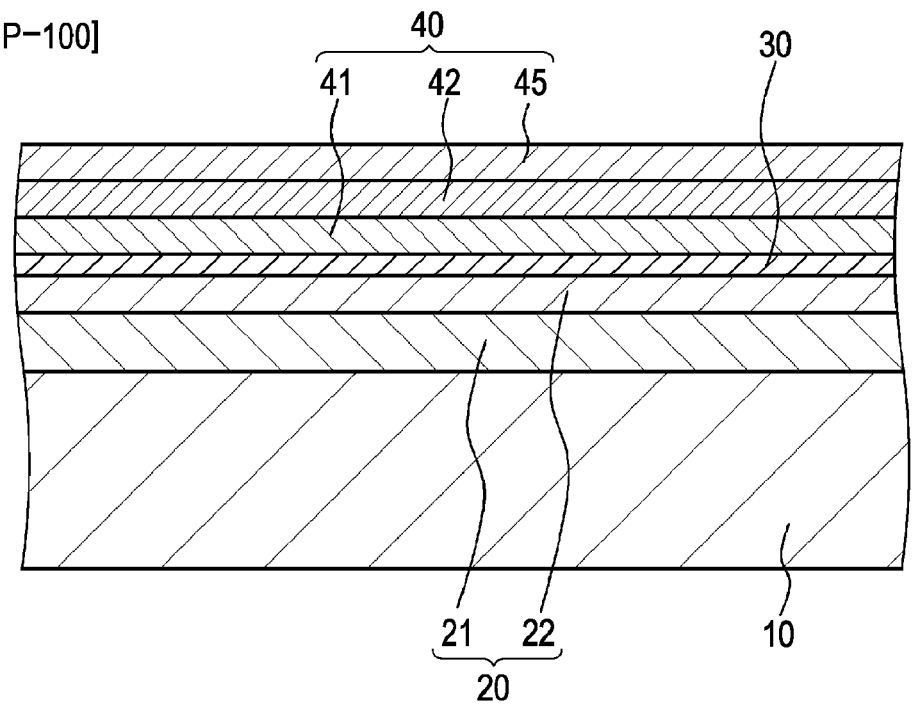
FIGS. 2A and 2B are schematic partial end elevation views of a substrate and the like for explaining a method for manufacturing the light emitting element in Example 1.

Films of the first conduction type (specifically, n-type) first compound semiconductor layer 20 (the first DBR layer 21 and the first clad layer 22), the active layer 30, and the second conduction type (specifically, p-type) second compound semiconductor layer 40 (the lower layer (second clad layer) 41, the middle layer (current confinement layer) 42, and the upper layer (second DBR layer) 45) are formed sequentially on the main surface of the substrate 10 formed from n-GaAs by using the MOCVD technology according to the related art (refer to FIG. 2A).

Step-110

Figure 2B:
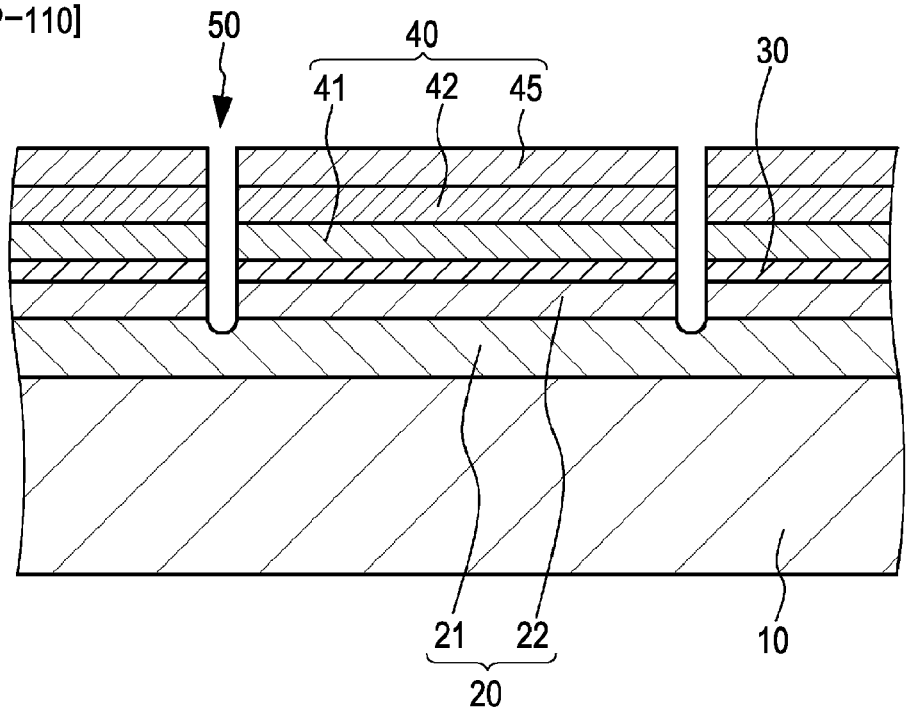
Figure 5A:
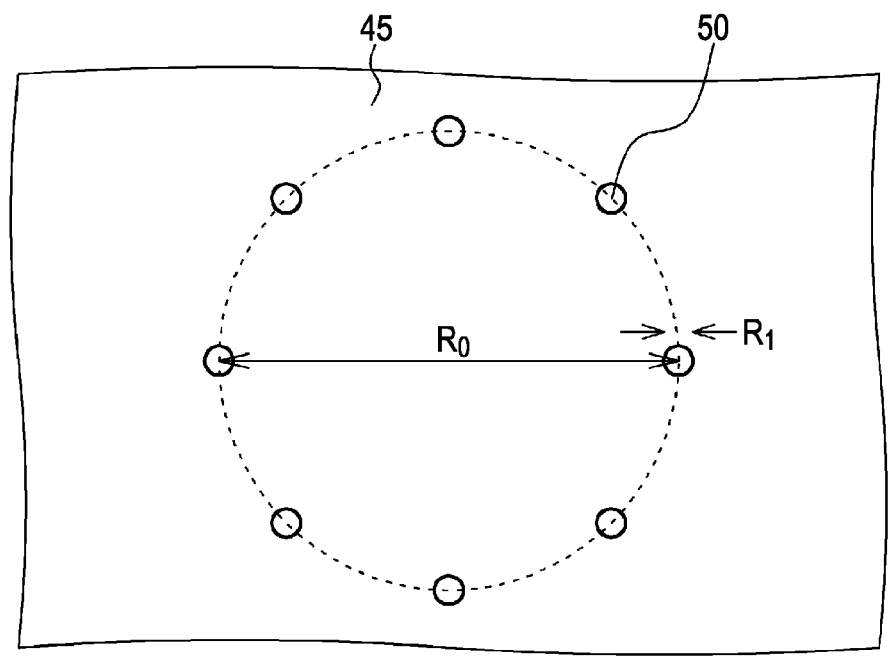
FIG. 5A is a schematic diagram of a second compound semiconductor layer viewed from above during a production process of the light emitting element in Example 1.
Figure 5B:
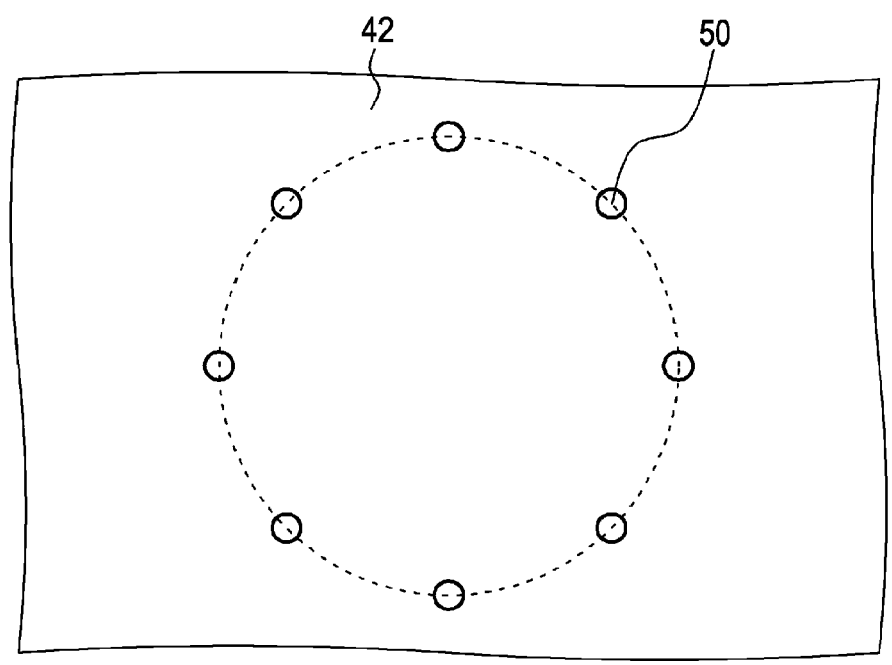
FIG. 5B is a schematic diagram of a middle layer cut with a virtual plane parallel to the main surface of a substrate, the diagram showing the state of proceeding of insulation treatment of the middle layer.

A plurality of point-like hole portions (micropores) 50 in a thickness direction are formed in at least a region of the second compound semiconductor layer 40 located outside a region to be provided with the current confinement region on the basis of the lithography and the dry etching technology. FIG. 2B is a schematic partial sectional view showing this state. FIG. 5A is a schematic diagram of the second compound semiconductor layer 40 viewed from above. FIG. 5B is a schematic diagram of the middle layer 42 cut with a virtual plane parallel to the main surface of the substrate 10. In Example 1, specifically, the hole portions 50 penetrate the second compound semiconductor layer 40 and the active layer 30 and extend to some midpoint in the first compound semiconductor layer 20 in the thickness direction. Here, the number M of hole portions 50 is specified to be eight, and the diameter $R_1$ of the hole portion 50 having a cross-section in the shape of a circle (refer to FIG. 5A) is specified to be 4 μm. The top portions of the plurality of point-like hole portions 50 are arranged on a virtual closed curve (specifically, a circle indicated by a dotted line shown in FIG. 5A, the circle having a diameter $R_0$ of 40 μm) located outside the region to be provided with the current confinement region. Therefore, $(M \times R_1^2)/R_0^2 = 0.08$ holds.

Step-120

Figure 3A:
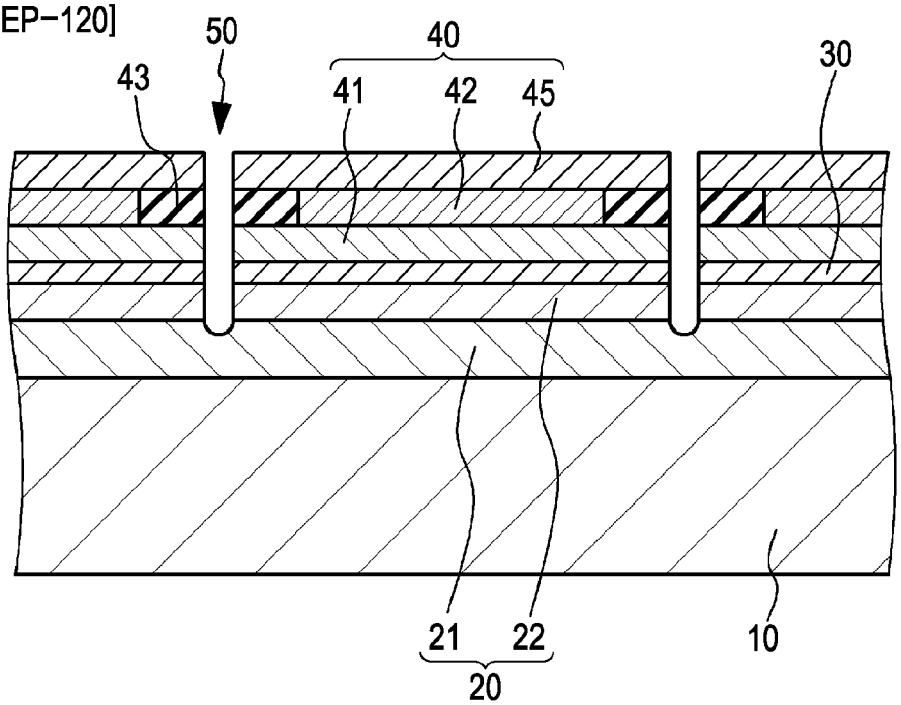
FIGS. 3A and 3B are schematic partial end elevation views of the substrate and the like in a step following the step shown in FIG. 2B, the diagrams explaining the method for manufacturing the light emitting element in Example 1.
Figure 3B:
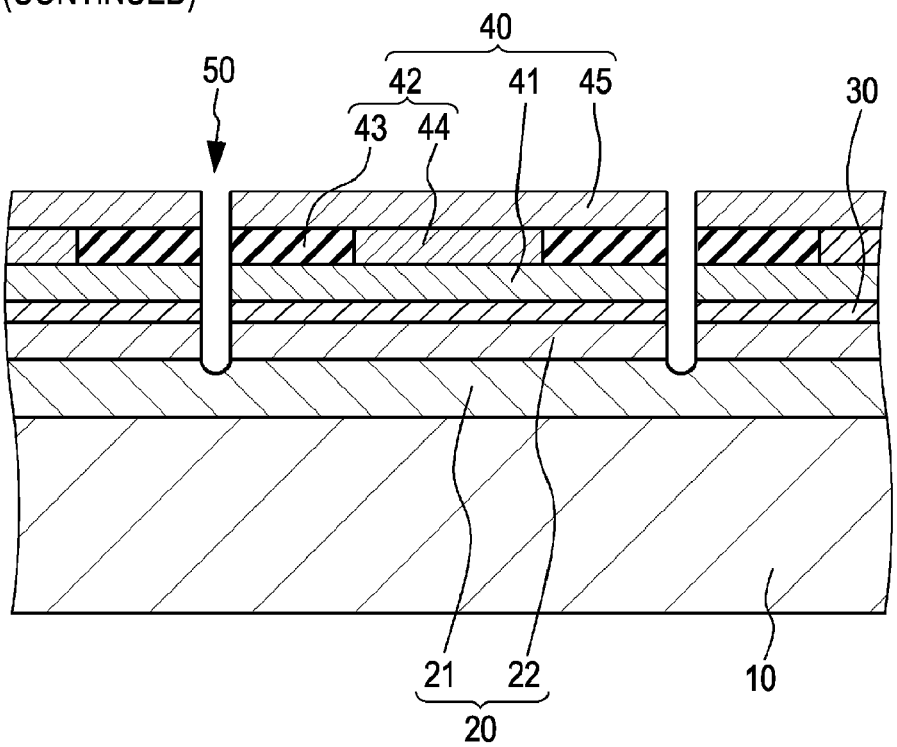
Figure 6A:
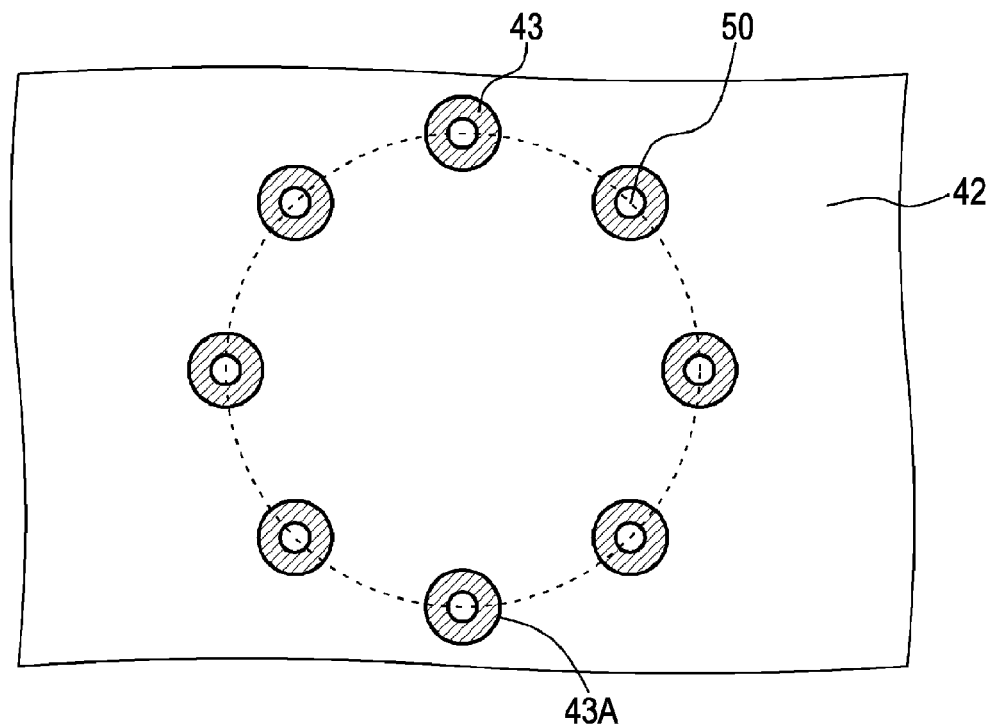
FIGS. 6A and 6B are schematic diagrams of the middle layer cut with the virtual plane parallel to the main surface of the substrate in a step following the step shown in FIG. 5B during the production process of the light emitting element in Example 1, the diagrams showing the state of proceeding of insulation treatment of the middle layer.
Figure 6B:
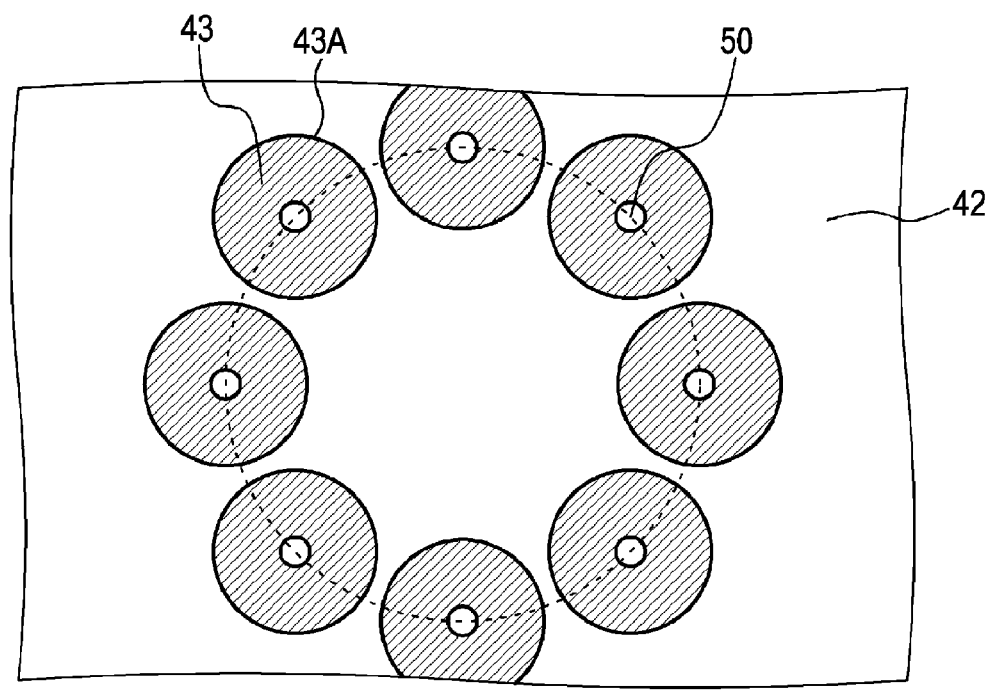
Figure 7:
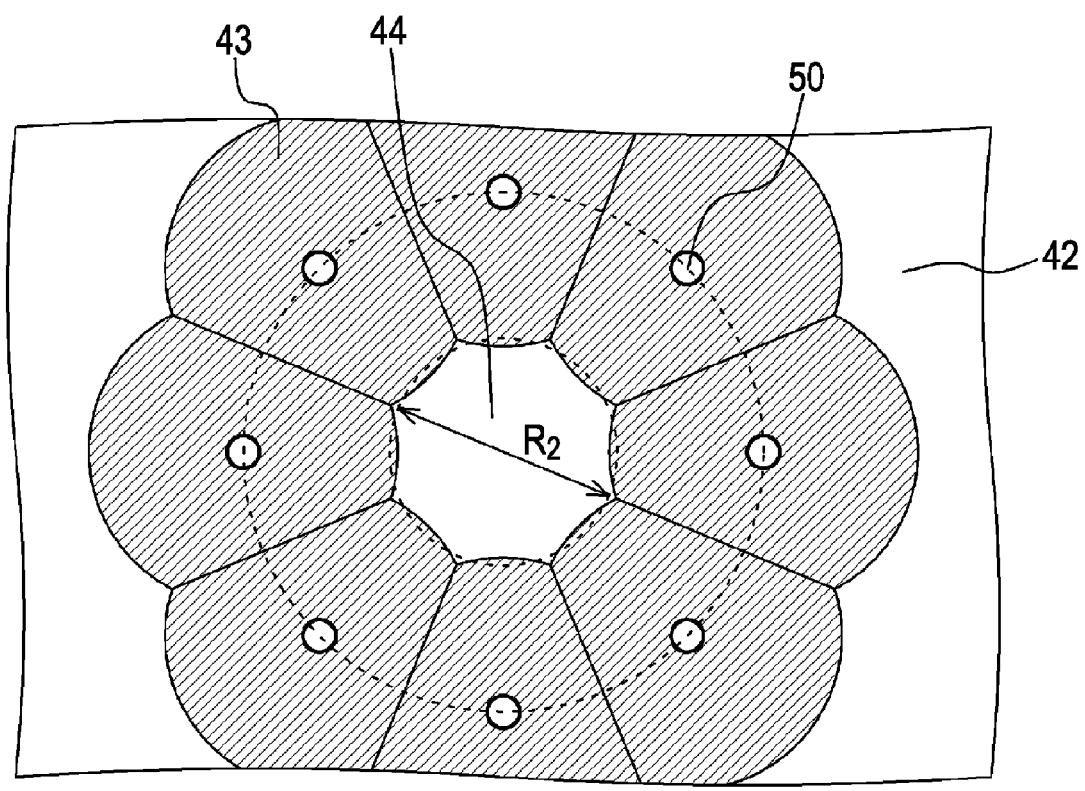
FIG. 7 is a schematic diagram of the middle layer cut with the virtual plane parallel to the main surface of the substrate in a step following the step shown in FIG. 6B, the diagram showing the state of formation of an insulating region.

An insulating region 43 is formed by subjecting a part of the second compound semiconductor layer 40 (specifically, middle layer 42) to an insulation treatment (specifically, an oxidation treatment) from side walls of hole portions 50, so as to produce the current confinement region 44 surrounded by the insulating region 43 in the second compound semiconductor layer 40. Specifically, the substrate 10 is exposed to an atmosphere of the air containing, for example, 1 percent by volume of steam at 100C. Consequently, oxidation of the middle layer 42 formed from AlAs is started from the side walls of the hole portions 50 due to steam. Regarding other compound semiconductor layers, the side walls of the hole portions 50 of the compound semiconductor layers are also exposed to the steam. However, the rate of the oxidation is very low as compared with that of the middle layer 42 formed from AlAs. Consequently, for example, the current confinement region 44 surrounded by the insulating region 43 in the middle layer 42 of the second compound semiconductor layer 40 can be produced by continuing the exposure to the above-described atmosphere for 10 minutes. FIG. 3A is a schematic partial sectional view showing the state in the midstream of formation of the insulating region 43. FIG. 3B is a schematic partial sectional view showing the state at the point in time when the formation of the insulating region 43 is completed. FIGS. 6A and 6B and FIG. 7 are schematic diagrams of the middle layer 42 cut with a virtual plane parallel to the main surface of the substrate 10. FIG. 6A shows the state just after the oxidation treatment is started. The state shown in FIG. 6B corresponds to the state shown in FIG. 3A. The state shown in FIG. 7 corresponds to the state shown in FIG. 3B. The formation of the insulating region 43 proceeds by the insulation treatment from the side wall of one hole portion 50, and the formation of another insulating region 43 proceeds by the insulation treatment from the side wall of another hole portion 50 adjacent to the one hole portion 50. FIG. 6B shows the state just before these two insulating regions 43 join together. In FIG. 6A, FIG. 6B, and FIG. 7 and in FIG. 8A and FIG. 10 described later, the insulating regions 43 are diagonally shaded for the purpose of clearly showing the insulating regions 43.

Figure 13A:
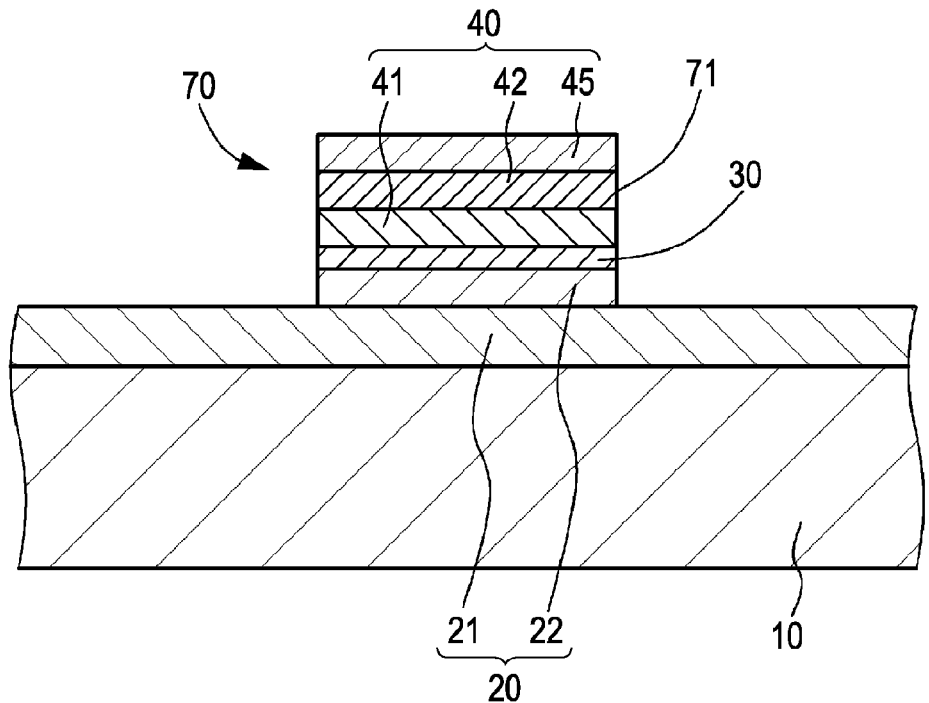
FIGS. 13A and 13B are schematic partial sectional views of a light emitting element according to a related art.
Figure 13B:
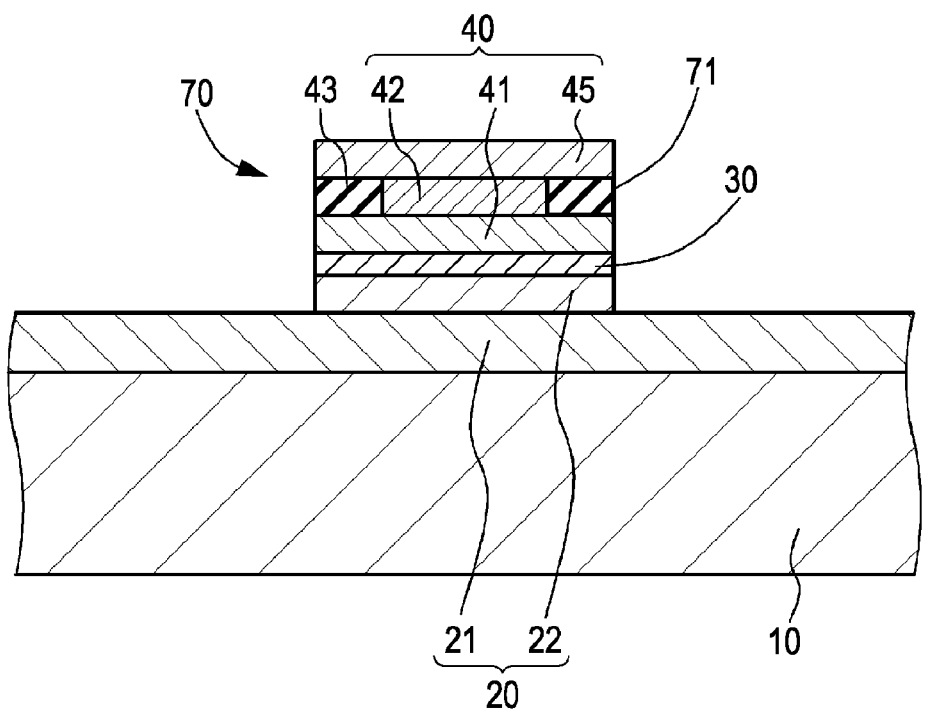
Figure 14A:
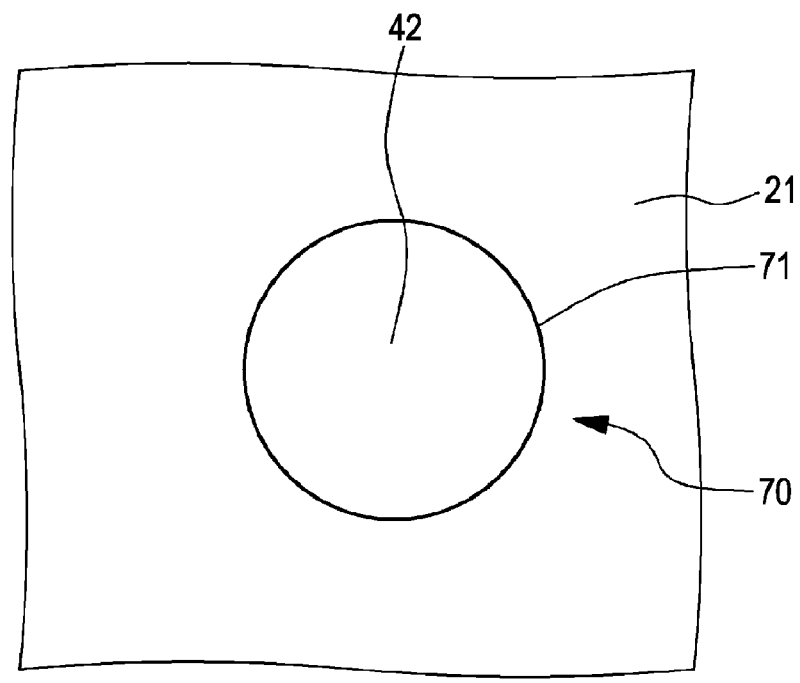
FIGS. 14A and 14B are schematic diagrams of a middle layer cut with a virtual plane parallel to a main surface of a substrate in a light emitting element according to the related art.
Figure 14B:
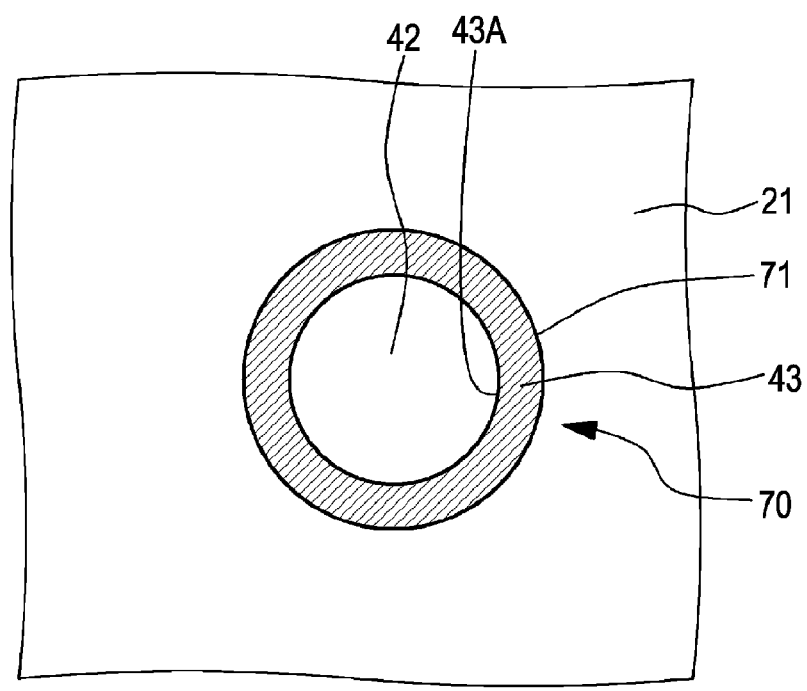

In the technology according to the related art, as is clear from schematic partial sectional views shown in FIGS. 13A and 13B and schematic diagrams of the middle layer 42 cut with a virtual plane parallel to the main surface of the substrate 10 shown in FIGS. 14A and 14B, a mesa structure 70 is produced by etching a first compound semiconductor layer 20, an active layer 30, and a second compound semiconductor layer 40 (the compositions of them are the same as those in Example 1) disposed on a substrate 10. Subsequently, a part (middle layer 42) of the second compound semiconductor layer 40 is oxidized from a side wall 71 of the mesa structure 70, so that a current confinement region 44 surrounded by the insulating region 43 is disposed in the middle layer 42 of the second compound semiconductor layer 40. In FIGS. 13A and 13B and FIGS. 14A and 14B, the same constituents as those in the light emitting element in Example 1 are indicated by the same reference numerals as those set forth above.

In the above-described method according to the related art, the rate of oxidation reaction increases as the oxidation proceeds. That is, since the oxidation is performed from the side surface 71 of the mesa structure 70, formation of the insulating region 43 in the middle layer 42 of the second compound semiconductor layer 40 proceeds toward the center portion of the mesa structure 70 by the oxidation treatment. At this time, the area of the boundary (insulating region front 43A), at which the oxidation proceeds, of the second compound semiconductor layer 40 decreases, and the amount of oxidation species (water molecules, oxygen molecules, and the like) per unit area of the insulating region front 43A increases. Consequently, as the oxidation proceeds, the rate of oxidation reaction increases, so that accurate control of the width of insulating region 43 becomes difficult.

On the other hand, in Example 1, when the insulation treatment (specifically, oxidation treatment) is applied to a part (specifically, middle layer 42) of the second compound semiconductor layer 40 from the side walls of the hole portions 50, formation of an insulating region 43 proceeds by the insulation treatment from a side wall of one hole portion 50, and formation of another insulating region 43 proceeds by the insulation treatment from a side wall of another hole portion adjacent to the one hole portion (refer to FIG. 3A and FIGS. 6A and 6B). The curvatures of the boundaries (insulating region front 43A) of insulating regions 43 developing by the insulation treatment take on positive values relative to the respective hole portions 50 before the two insulating regions 43 join together. Alternatively, the lengths of the boundaries (insulating region front 43A) of insulating regions developing by the insulation treatment increases as the insulation treatment proceeds before the two insulating regions 43 join together. Consequently, formation of the insulating region 43 in the middle layer 42 of the second compound semiconductor layer 40 proceeds toward the center portion of the mesa structure 70 by the oxidation treatment. At this time, the area of the boundary (insulating region front 43A), at which the oxidation proceeds, of the second compound semiconductor layer 40 increases, and the amount of oxidation species (water molecules, oxygen molecules, and the like) per unit area of the insulating region front 43A decreases. As a result, the rate of oxidation reaction decreases as the oxidation proceeds, so that the width of insulating region 43 can be easily accurately controlled on the basis of the control of the oxidation time.

Step-130

Figure 4A:
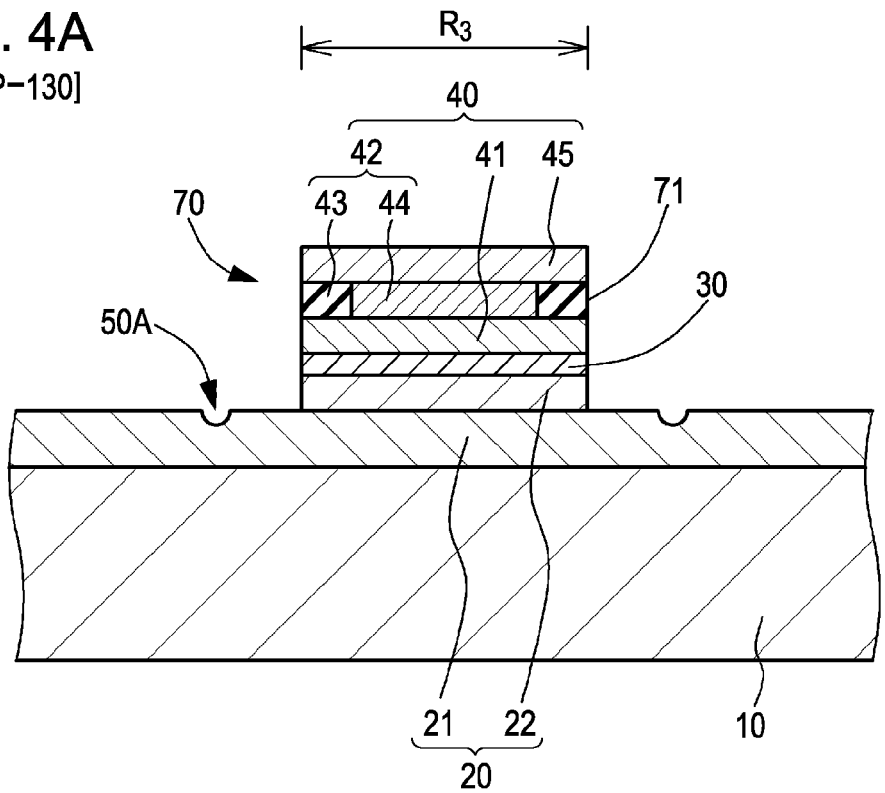
FIGS. 4A and 4B are schematic partial end elevation views of the substrate and the like in a step following the step shown in FIG. 3B, the diagrams explaining the method for manufacturing the light emitting element in Example 1.
Figure 4B:
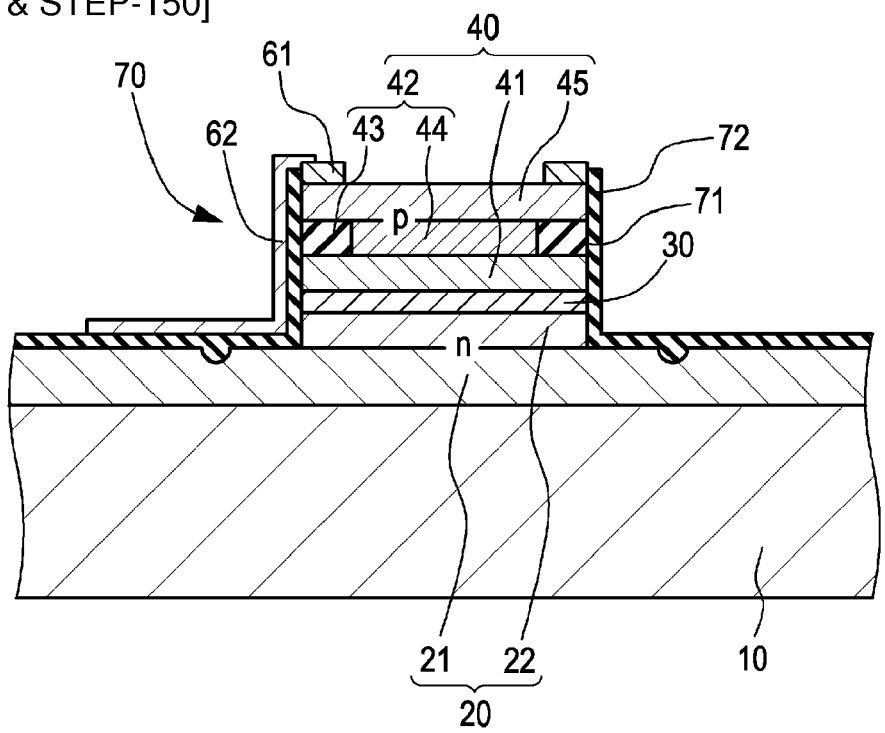

A part of the second compound semiconductor layer 40, the active layer 30, and the first compound semiconductor layer 20 are removed selectively on the basis of, for example, the lithography and the etching technology so as to expose a part of the first compound semiconductor layer 20 and produce a columnar (for example, in the shape of a hollow cylinder or a circular column) mesa structure 70 including at least the remaining second compound semiconductor layer 40 and active layer 30 in the shape of a type of island (refer to FIG. 4A). More specifically, the mesa structure 70 is composed of a part of the first compound semiconductor layer 20, the active layer 30, and the second compound semiconductor layer 40 in that order from the bottom. The mesa structure 70 is surrounded by the exposed first compound semiconductor layer 20. In some cases, as shown in FIG. 4A, traces 50A of the hole portions 50 are left.

Step-140

An insulating layer 72 is formed from, for example, $SiO_2$ on the side surface 71 of the mesa structure 70 and the exposed first compound semiconductor layer 20 on the basis of, for example, a CVD method and the etching technology.

Step-150

A ring-shaped second electrode (p-side electrode 61) is formed around the perimeter of the top surface of the exposed second compound semiconductor layer 40 on the basis of, for example, a so-called lift-off method and the vacuum deposition method. An extension portion 62 is extended from the p-side electrode 61 and is further extended over the insulating layer 72 (refer to FIG. 4B). A pad portion 63 is formed on a portion of the extension portion 62 located above the first compound semiconductor layer 20. A first electrode (n-side electrode 64) is formed on the back surface of the substrate 10. The first electrode (n-side electrode 64) is connected to the first compound semiconductor layer 20 through the substrate 10. After an alloying treatment is performed, the light emitting elements are individualized (separated) by, for example, a dicing method, so that the light emitting element in Example 1 shown in FIGS. 1A and 1B can be produced.

In the etching of the second compound semiconductor layer 40 and the active layer 30 to form the mesa structure 70 in Step-130 or in Step-230 or Step-310 described later, etching of the first compound semiconductor layer 20 also proceeds at the bottom of the hole portion 50. However, the hole portion is fine and, therefore, the degree of proceeding of etching of the first compound semiconductor layer 20 at the bottom of the hole portion 50 is low. Consequently, traces of hole portions 50 are left on the first compound semiconductor layer 20. However, these remaining traces 50A of the hole portions 50 do not become very deep. Therefore, the surface of the exposed first compound semiconductor layer 20 is relatively flat. The extended portion 62 and the pad portion 63 are easily formed, or the flexibility in positioning of formation of the extended portion 62 and the pad portion 63 increases. As a result, the yield in production of the light emitting element can be improved.

Example 2

Figure 9:
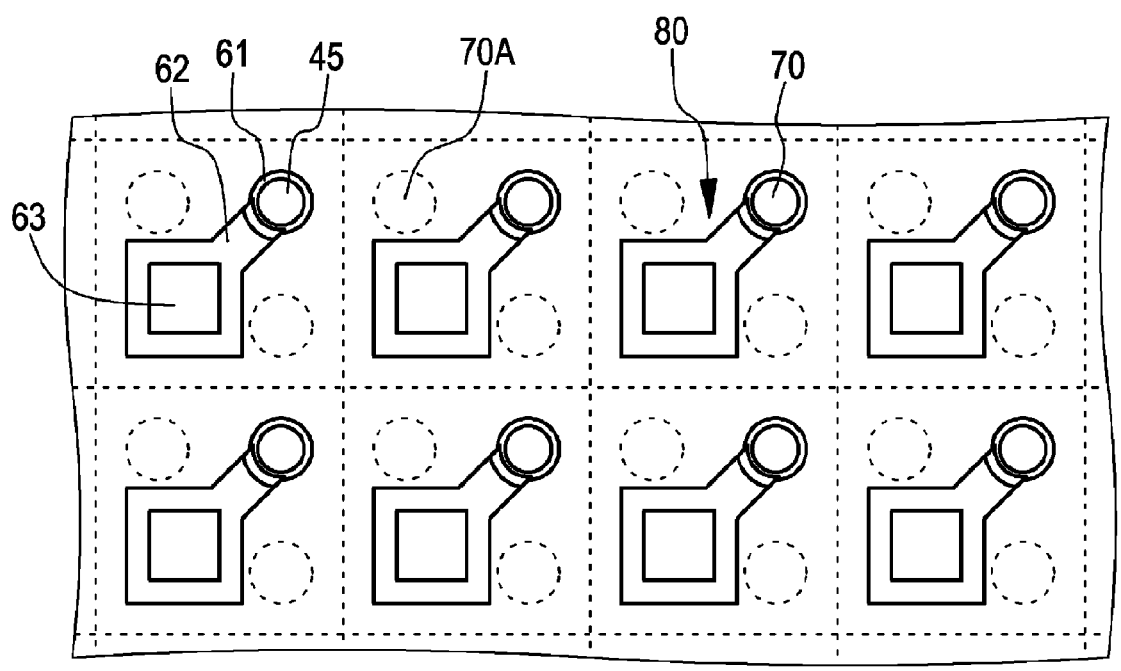
FIG. 9 is a schematic partial plan view of the mesa structure viewed from above in a step following the step shown in FIG. 8B during the production process of the light emitting element assembly in Example 2.

Example 2 relates to a light emitting element assembly and a method for manufacturing the light emitting element assembly according to embodiments of the present invention. FIG. 9 is a schematic partial plan view of the light emitting element assembly in Example 2. Each light emitting element in Example 2 has the same configuration and structure as those of the light emitting element described in Example 1. Therefore, detailed explanations will not be provided.

In Example 2, $K_1$ light emitting elements ($K_1$ mesa structures 70) are disposed in each region 80 to be provided with a light emitting element assembly. Specifically, $K_0$ is specified to be four, and $K_1$ is specified to be one in Example 2. Circles with reference numeral 70A are indicated by a dotted line and show ($K_0 - K_1$) units of current confinement regions which have not been used for constituting the light emitting element. The areas of $K_0$ current confinement regions are differentiated from each other, although the areas have the same size in the drawing, for the sake of convenience. The same goes for Example 3.

A method for manufacturing the light emitting element assembly in Example 2 will be described below.

Step-200

A first conduction type (specifically, n-type) first compound semiconductor layer 20, an active layer 30, and a second conduction type (specifically, p-type) second compound semiconductor layer 40 are formed sequentially on a substrate 10. Specifically, a step similar to Step-100 in Example 1 is performed.

Step-210

A plurality of point-like hole portions 50 are formed in a thickness direction in at least a region of the second compound semiconductor layer 40 located outside each region to be provided with $K_0$ discrete current confinement regions (where $K_0$ represents an integer of two or more, and is four in Example 2) in each region 80 to be provided with a light emitting element assembly. Specifically, a step similar to Step-110 in Example 1 may be performed.

Step-220

Figure 8A:
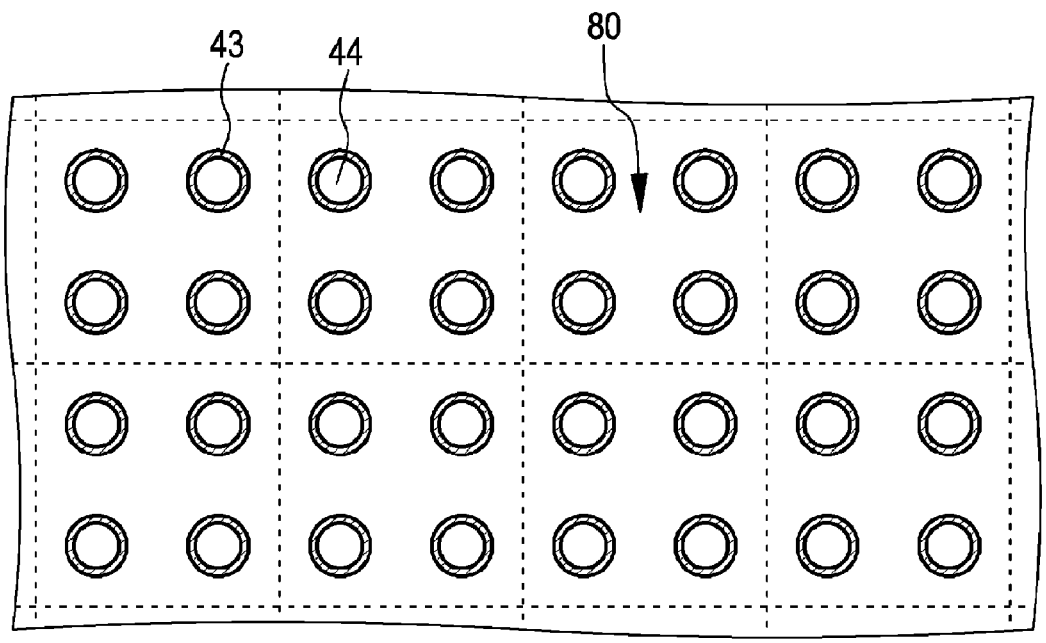
FIG. 8A is a schematic partial plan view of a middle layer cut with the virtual plane parallel to the main surface of the substrate and FIG. 8B is a schematic partial plan view of a mesa structure viewed from above during the production process of a light emitting element assembly in Example 2.

An insulating region 43 is formed by subjecting a part (specifically, middle layer 42) of the second compound semiconductor layer 40 to an insulation treatment from side walls of the hole portions 50 so as to produce the current confinement region 44 surrounded by $K_0$ insulating regions 43 in a part (middle layer 42) of the second compound semiconductor layer 40. Specifically, a step similar to Step-120 in Example 1 may be performed. FIG. 8A is a schematic partial plan view of the middle layer 42 in the state of being cut with the virtual plane parallel to the main surface of the substrate 10. The boundaries of the regions 80 to be provided with a light emitting element assembly are indicated by a dotted line, and the insulating regions 43 are diagonally shaded.

Step-230

Figure 8B:
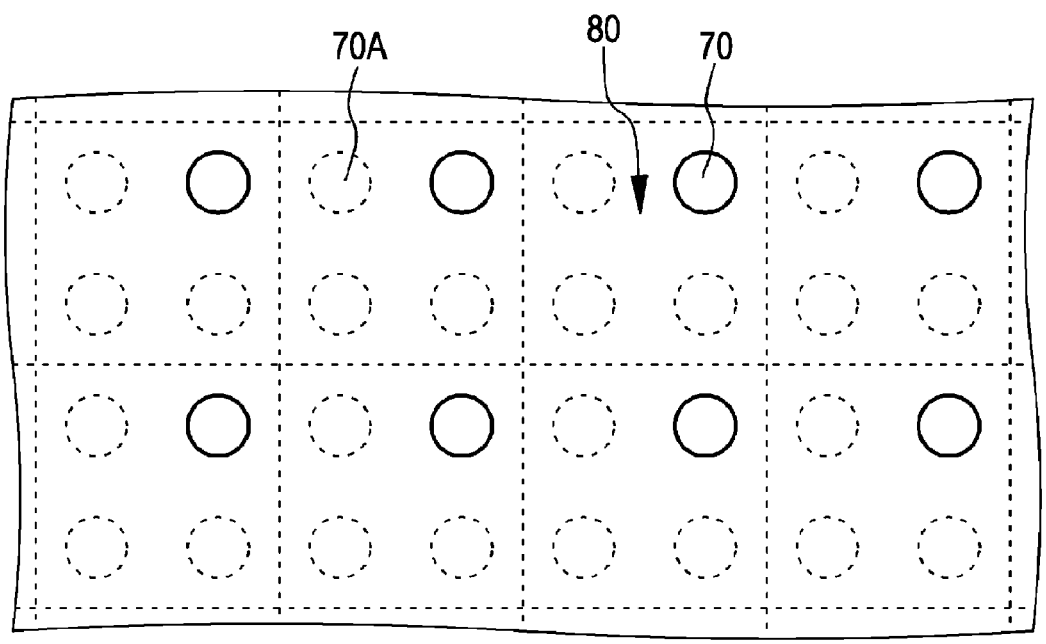

At least a part of the second compound semiconductor layer 40 and the active layer 30 are selectively removed so as to expose a part of the first compound semiconductor layer 20 and produce $K_1$ units (in Example 2, $K_1$ is one) of mesa structures 70 including at least the remaining second compound semiconductor layer 40 and active layer 30 in the shape of a type of island, in order to form $K_1$ light emitting elements in each region 80 to be provided with a light emitting element assembly. Specifically, in one region 80 to be provided with a light emitting element assembly, a mesa structure 70 including one desired current confinement region 44 is left by the lithography and the etching technology in such a way that the above-described current confinement region 44 is left from among four current confinement regions 44 (refer to the schematic partial plan view shown in FIG. 8B).

Step-240

As in Step-140 in Example 1, an insulating layer 72 is formed from, for example, $SiO_2$ on the side surface 71 of the mesa structure 70 and the exposed first compound semiconductor layer 20 on the basis of, for example, the CVD method and the etching technology.

Step-250

A ring-shaped second electrode (p-side electrode 61) is formed around the perimeter of the top surface of the exposed second compound semiconductor layer 40 on the basis of, for example, the so-called lift-off method and the vacuum deposition method. An extension portion 62 is extended from the p-side electrode 61 and is further extended over the insulating layer 72. A pad portion 63 is formed on a portion of the extension portion 62 located above the first compound semiconductor layer 20 (refer to the schematic partial plan view shown in FIG. 9). A first electrode (n-side electrode 64) is formed on the back surface of the substrate 10. The first electrode (n-side electrode 64) is connected to the first compound semiconductor layer 20 through the substrate 10. After an alloying treatment is performed, the light emitting element assemblies are separated by cutting the boundaries of the regions 80 to be provided with a light emitting element assembly by, for example, the dicing method, so that the light emitting element assembly in Example 2 can be produced.

In Example 2 or in Example 3 described later, $K_1$ mesa structures 70 are formed in each region 80 to be provided with a light emitting element assembly, and the mesa structure 70 is a basic structure of a light emitting element. Therefore, the steps upstream from the step of forming the mesa structure 70 can be standardized by, for example, changing the areas of $K_0$ current confinement regions 44 from each other and designating in advance a current confinement region 44 to be left, so that the steps can be simplified and streamlined.

Example 3

Example 3 is a modification to Example 2. In Example 2, $K_0$ is specified to be four, and $K_1$ is specified to be one. On the other hand, $K_0$ is specified to be thirty-two, and $K_1$ is specified to be eight in example 3. In each region 80 to be provided with a light emitting element assembly, thirty-two current confinement regions 44 are formed and, thereafter, eight mesa structures 70 are left. The areas of current confinement regions 44 in eight mesa structures 70 are nearly equal. In general, a laser array is composed of laser elements having the same characteristics. That is, it is ideal that the areas of current confinement regions 44 in finally formed eight mesa structures 70 are equal. If the values of diameter $R_0$ of the regions to be provided with the mesa structure are equal, the areas of the formed current confinement regions 44 are supposed to become nearly equal. However, it may be difficult to allow the area of the current confinement region 44 to become an intended value in practice. According to Example 3, a method for solving such a problem is provided. The region to be provided with thirty-two mesa structures are divided into eight groups, each including four levels of diameters $R_0$. Consequently, after the insulation treatment (specifically, oxidation treatment) is performed, thirty-two current confinement regions 44 are divided into eight groups, each including four levels of areas. Therefore, it is favorable that eight mesa structures including the current confinement region 44 having an area at a desired level are left finally. As described above, the area can be selected from four levels of areas, so that the production yield of the laser element is improved. However, in the case where the laser array is composed of laser elements having different characteristics depending on uses, the areas of the current confinement regions may be designed to become different from each other.

A method for manufacturing the light emitting element assembly in Example 3 will be described below.

Step-300

Figure 10:
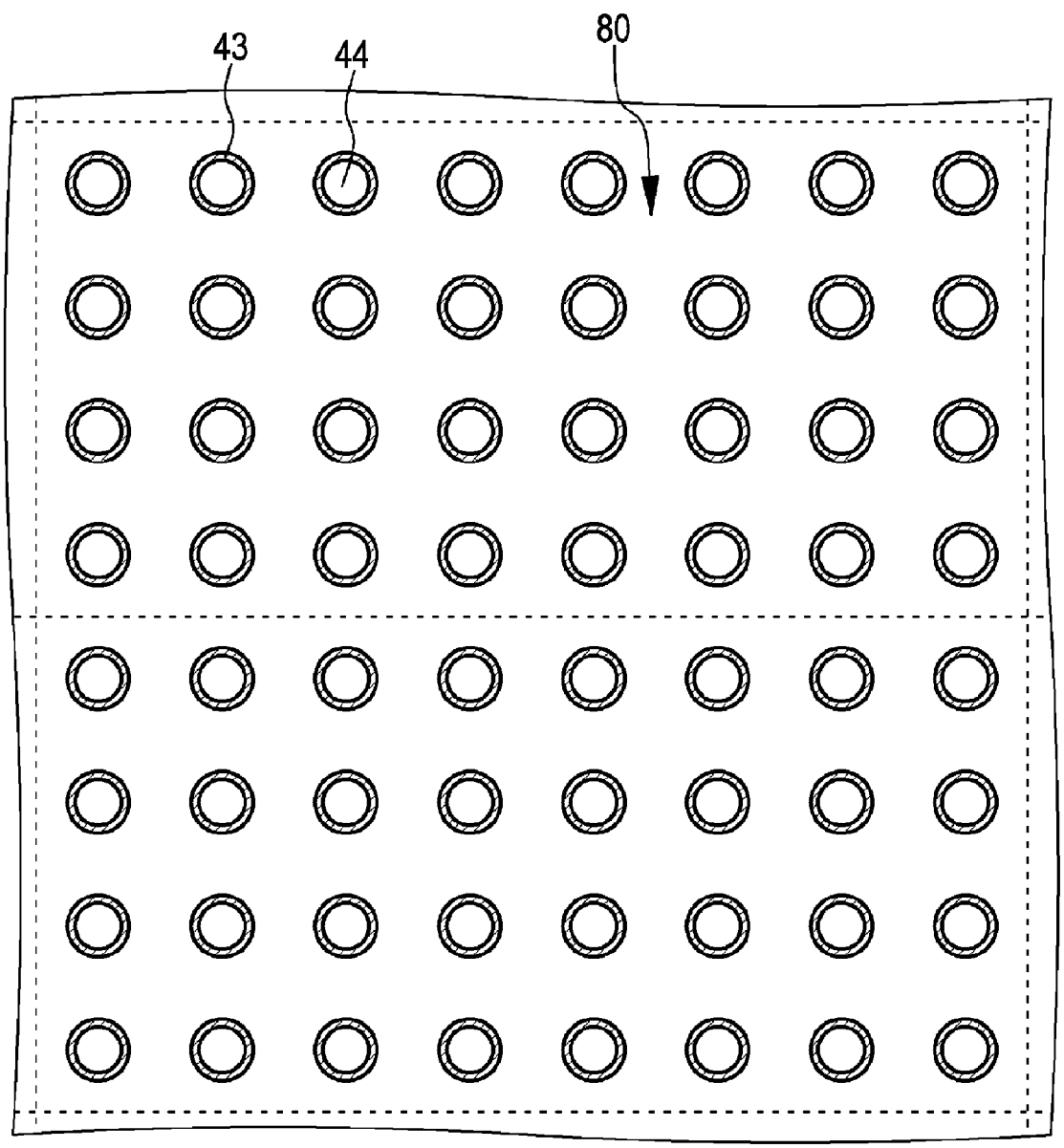
FIG. 10 is a schematic partial plan view of a middle layer cut with a virtual plane parallel to a main surface of a substrate during a production process of a light emitting element assembly in Example 3.

Steps similar to Step-200 to Step-220 in example 2 are performed. FIG. 10 is a schematic partial plan view of this state. The boundaries of the regions 80 to be provided with a light emitting element assembly are indicated by a dotted line, and the current confinement regions 44 are indicated by circles surrounded by the insulating regions 43.

Step-310

Figure 11:
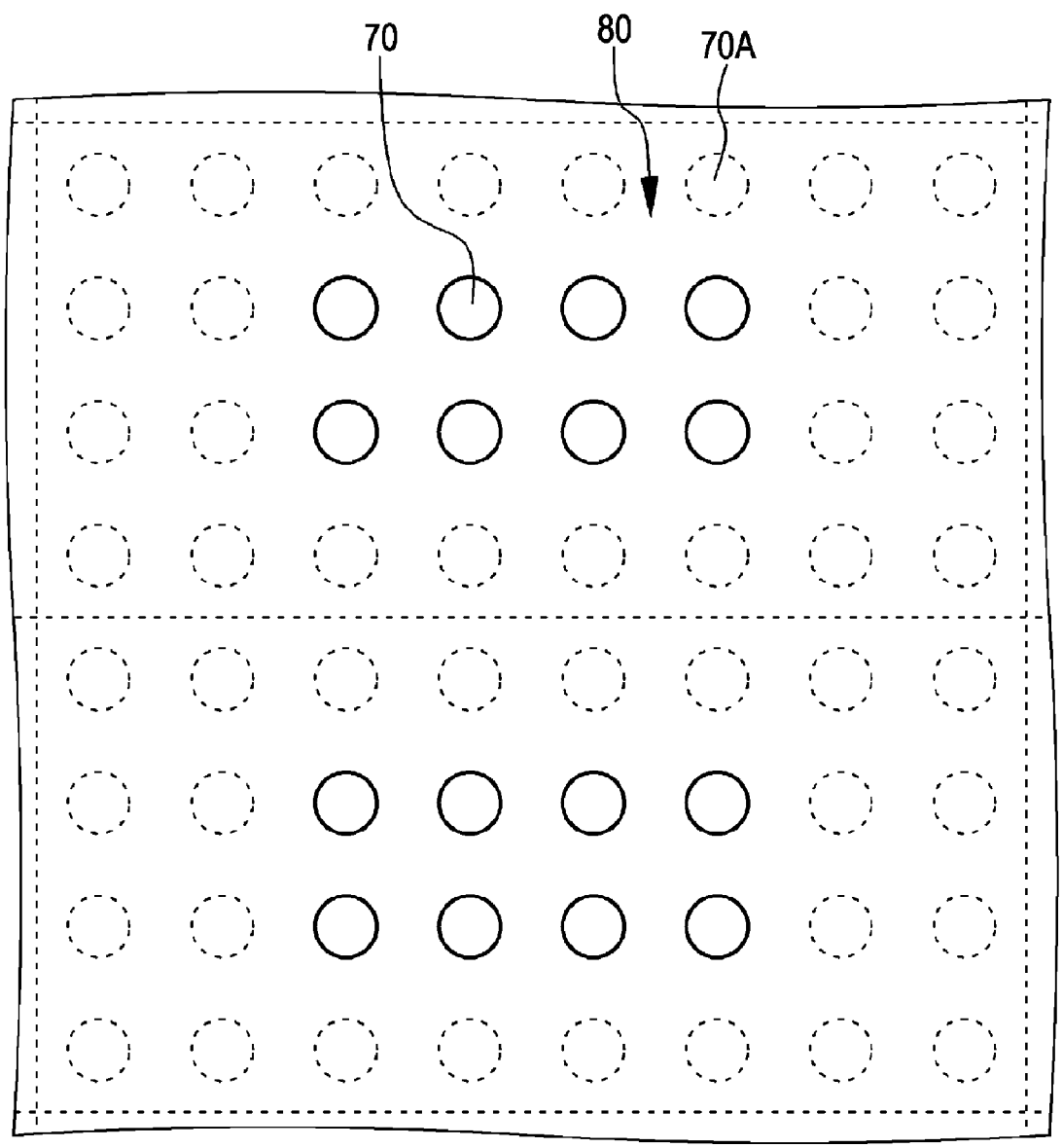
FIG. 11 is a schematic partial plan view of a mesa structure viewed from above in a step following the step shown in FIG. 10 during the production process of the light emitting element assembly in Example 3.

In one region 80 to be provided with a light emitting element assembly, eight desired current confinement regions 44 are left from among thirty-two current confinement regions 44 by the lithography and the etching technology so as to produce eight mesa structures 70 (refer to the schematic partial plan view shown in FIG. 11).

Step-320

As in Step-140 in Example 1, an insulating layer 72 is formed from, for example, $SiO_2$ on the side surface 71 of the mesa structure 70 and the exposed first compound semiconductor layer 20 on the basis of, for example, the CVD method and the etching technology.

Step-330

Figure 12:
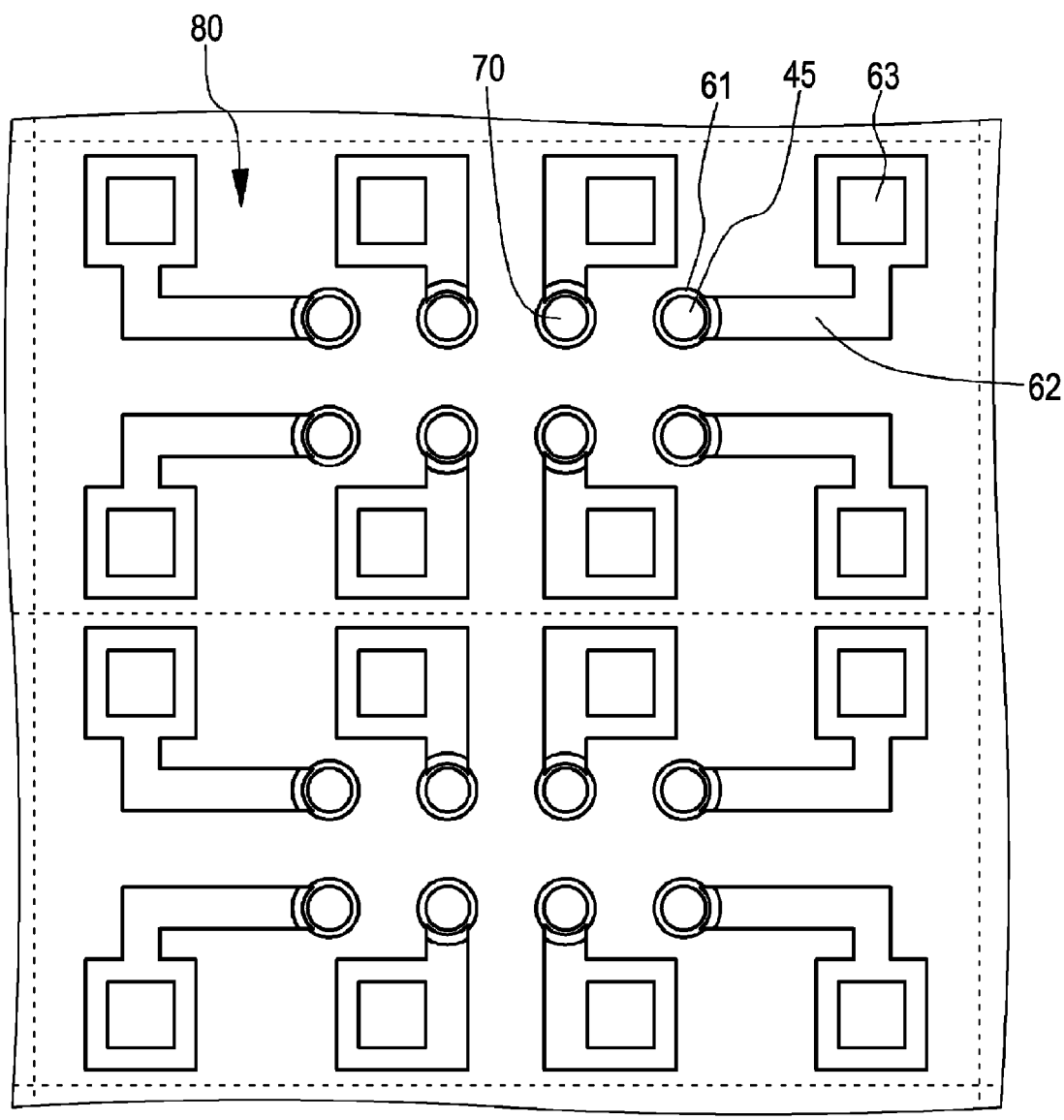
FIG. 12 is a schematic partial plan view of the mesa structure viewed from above in a step following the step shown in FIG. 11 during the production process of the light emitting element assembly in Example 3.

A ring-shaped second electrode (p-side electrode 61) is formed around the perimeter of the top surface of the exposed second compound semiconductor layer 40 on the basis of, for example, the so-called lift-off method and the vacuum deposition method. An extension portion 62 is extended from the p-side electrode 61 and is further extended over the insulating layer 72. A pad portion 63 is formed on a portion of the extension portion 62 located above the first compound semiconductor layer 20 (refer to the schematic partial plan view shown in FIG. 12). A first electrode (n-side electrode 64) is formed on the back surface of the substrate 10. The first electrode (n-side electrode 64) is connected to the first compound semiconductor layer 20 through the substrate 10. After an alloying treatment is performed, the light emitting element assemblies are separated by cutting the boundaries of the regions 80 to be provided with a light emitting element assembly by, for example, the dicing method, so that the light emitting element assembly in Example 3 can be produced.

Up to this point, the present invention has been described on the basis of the preferred examples. However, the present invention is not limited to these examples. The configurations and the structures of the light emitting element and the light emitting element assembly, the materials and the compositions constituting the light emitting element, and the like, which have been explained in the examples, are no more than exemplifications and may be changed appropriately. The laminated structure may include the second compound semiconductor layer, the active layer, and the first compound semiconductor layer sequentially from the substrate. That is, the laminated structure, which is a reverse equivalent of the laminated structure of the light emitting element explained in Example 1 to Example 3 and in which the second DBR layer 45 of the second compound semiconductor layer 40 is the lowermost layer and the first DBR layer 21 of the first compound semiconductor layer 20 is the uppermost layer, may be formed on an appropriate substrate. Furthermore, an insulating substrate may be used as the substrate 10. The structure of the light emitting element explained in Example 1 may also be applied to an edge emitting laser element for emitting light from an end surface.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a light emitting element assembly, the method comprising the steps of:
   (A) sequentially forming a first compound semiconductor layer having a first conduction type, an active layer, and a second compound semiconductor layer having a second conduction type on a substrate;
   (B) forming a plurality of point-like hole portions penetrating through the second compound layer and the active layer in a thickness direction, the plurality of point-like hole portions being located outside each $K_0$ discrete current confinement regions having different sizes (where $K_0$ represents an integer of two or more) and located in each region to be provided with a light emitting element assembly;
   (C) subjecting a part of the second compound semiconductor layer to an insulation treatment from side walls of the hole portions to produce $K_0$ current confinement regions, wherein each current confinement region is surrounded by an insulating formation in a part of the second compound semiconductor layer;
   (D) removing at least a part of the second compound semiconductor layer and the active layer selectively to expose a part of the first compound semiconductor layer and produce $K_1$ mesa structures (where $K_1$ represents an integer of one or more, and $K_1<K_0$) including at least the remaining second compound semiconductor layer and active layer in order to form $K_1$ light emitting elements in each region to be provided with a light emitting element assembly;
   (E) forming a first electrode connected to the first compound semiconductor layer, and forming a second electrode at a part of the top surface of the second compound semiconductor layer in each of $K_1$ mesa structures in each region to be provided with a light emitting element assembly; and
   (F) separating each region to be provided with a light emitting element assembly.

2. The method for manufacturing a light emitting element assembly according to claim 1, wherein the value of $K_1$ is one.

3. The method for manufacturing a light emitting element assembly according to claim 1, wherein the value of $K_1$ is an integer of two or more.

* * * * *